United States Patent [19]

Flint

[11] 4,047,627

[45] Sept. 13, 1977

[54] MASK PLATE HANDLING METHOD

[75] Inventor: Alan G. Flint, San Jose, Calif.

[73] Assignee: GCA Corporation, Bedford, Mass.

[21] Appl. No.: 652,514

[22] Filed: Jan. 26, 1976

Related U.S. Application Data

[62] Division of Ser. No. 510,284, Sept. 30, 1974, Pat. No. 3,960,277.

[51] Int. Cl.² .......................................... B65G 47/91
[52] U.S. Cl. ............................................. 214/152
[58] Field of Search ................ 214/1 BE, 1 R, 1 BH, 214/1 BV, 1 BT, 1 BB, 1 B, 1 BS, 1 BC, 1 BD, 1 C, 152; 302/2 R, 31, 29

[56] References Cited

U.S. PATENT DOCUMENTS

| | | | |
|---|---|---|---|
| 3,645,581 | 2/1972 | Lasch, Jr. et al. | 302/2 R |
| 3,797,889 | 3/1974 | Wilkinson | 302/2 R |
| 3,865,254 | 2/1975 | Johannsmeier | 214/1 BE X |

Primary Examiner—Frank E. Werner
Attorney, Agent, or Firm—Flehr, Hohbach, Test, Albritton & Herbert

[57] ABSTRACT

Apparatus and method for handling articles, such as glass or ceramic plates, commonly referred to as masks, employed in the manufacture of semi-conductor devices. The masks are transported between two predetermined stations with a treating operation being performed thereon at an intermediate station. The subject apparatus utilizes a fluid bearing for removing a plurality of masks in sequence from an indexable carrier and for accurately positioning the masks in sequence relative to a vacuum transfer arm. The transfer arm positions the masks in a precisely oriented location on a rotatable vacuum chuck so that a predtermined operation may be formed thereon. Another vacuum transfer arm then moves the treated masks in sequence from the vacuum chuck and places the same onto another fluid bearing for introduction thereby into another indexable carrier. Specially designed vacuum transfer arms, and means for accurately positioning masks in sequence relative to an infeed transfer arm for precise positioning thereby on the vacuum chuck, are employed so that damage to the relatively fragile masks during transfer to and from, and spinning at, the treating station is obviated.

4 Claims, 4 Drawing Figures

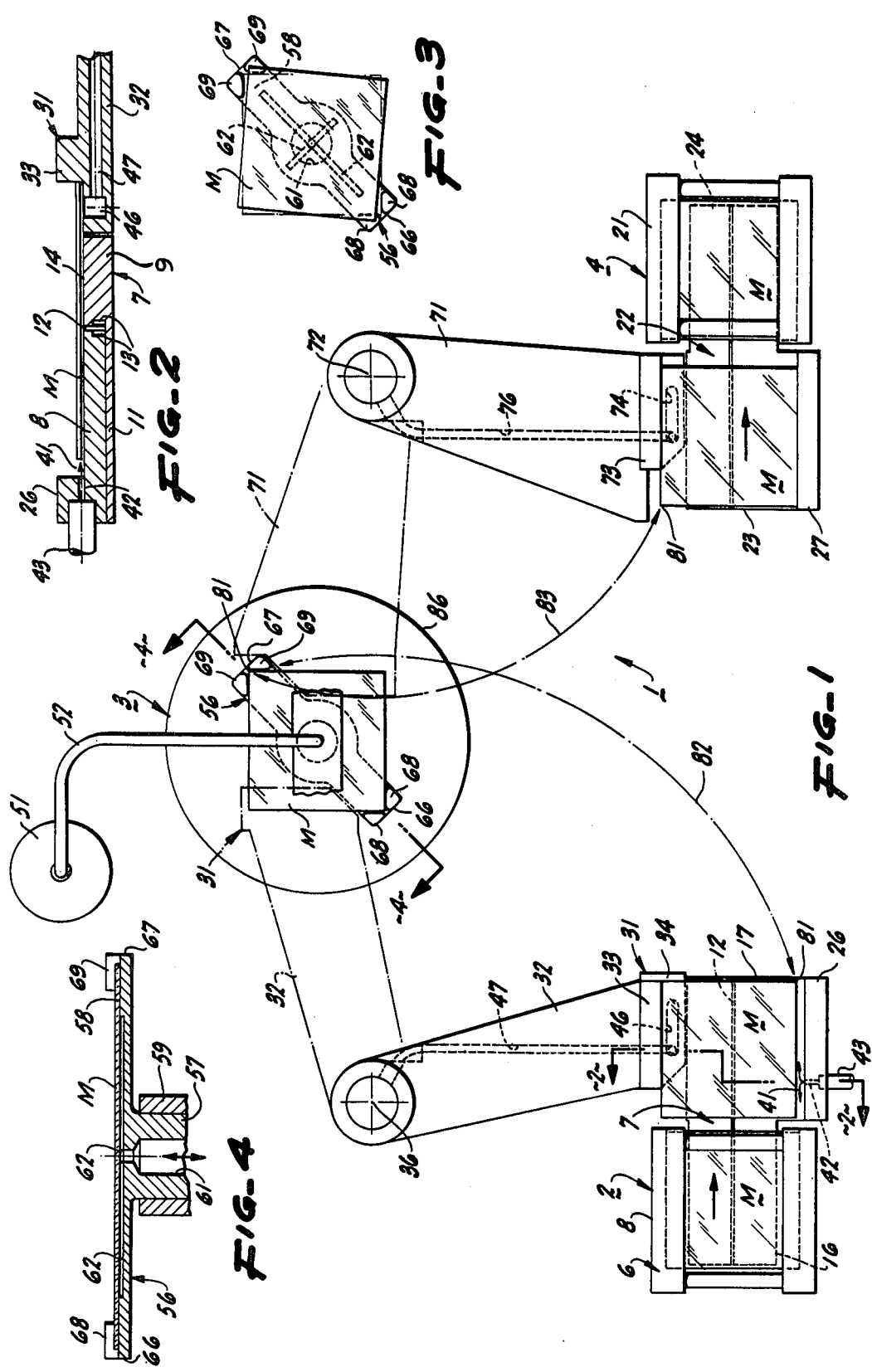

MASK PLATE HANDLING METHOD

This is a division of application Ser. No. 510,284 filed Sept. 30, 1974, now U.S. Pat. No. 3,960,277 issued June 1, 1976.

BACKGROUND OF THE INVENTION

1. Field of the Invention

This invention relates to the field of transporting articles, particularly articles of a fragile nature. More particularly, this invention relates to the field of automatic handling and moving articles between predetermined stations to and from an intermediate treatment station at which manufacturing procedures are effected on the articles in sequence.

Still more particularly, this invention relates to the field of handling and transporting fragile flat plate-like articles, such as glass or ceramic substrates commonly utilized in the electronics industry in the manufacture of semi-conductor devices, and for treating such substrates during manufacturing procedures. Herein such substrates are referred to as "masks". Such masks are generally in the form of a flat plate having a square or rectangular configuration formed, as noted, from glass, a suitable ceramic, or other suitable material commonly employed in the manufacturing of semi-conductor devices.

Still more particularly, this invention relates to the field of mask transportation means and handling methods which utilize a fluid bearing track adjacent each of an indexable infeed and discharge mask carrier or magazine, coupled with cooperable vacuum transfer arms for accepting masks from the outfeed magazine, and for transferring the same to and precisely locating the masks on a rotatable intermediate vacuum chuck.

While the specific aspects of the handling apparatus and method disclosed herein are related to the handling and treatment of fragile masks, it should be understood that the novel handling and transporting aspects of this invention are utilizible in conjunction with the handling of various other square or rectangular plate-like articles, particularly those of a fragile nature, where precise positioning of such articles relative to a predetermined station is required.

2. Description of the Prior Art

Fluid bearing track structures for transporting articles of various types have been known heretofore. Representative of prior art in which substrate handling apparatus and methods utilizing fluid bearings with indexable outfeed and discharge conveyors are the patents to Lasch, Jr. et al. U.S. Pat. No. 3,645,581 dated Feb. 29, 1972, and Lasch, Jr. U.S. Pat. No. 3,718,371, dated Feb. 27, 1973. Other patents illustrating fluid bearing track structures of various types also have been known heretofore as cited in such noted patents.

The present invention, however, is not directed to known details of construction of indexable magazines for masks or to fluid bearing track structures which may be associated therewith. As pointed out hereinafter and in the appended claims, the present invention is directed to the precise positioning of rectangular or square mask plates to facilitate transfer thereof onto a rotatable vacuum chuck for treatment thereon.

While indexable magazines and fluid bearing track structures have been disclosed in the noted patents and others heretofore, none of such patents or other prior art known to applicant discloses or describes the improved combination of structural features and handling method steps described herein. Therefore, so far as is known, the apparatus and method of this invention have not been known heretofore, particularly in conjunction with the transportation of fragile substrates, such as glass or ceramic masks utilized in the production of semi-conductor devices.

SUMMARY OF THE INVENTION

The present invention relates to an improved apparatus and method for handling polygonal plates, particularly those of a fragile nature, such as square glass or ceramic masks utilized in the manufacture of semi-conductor devices. However, it should be understood that such reference hereinafter in the specification and claims is intended to incorporate within its purview plates having other than a square configuration, such as rectangular, in which a precise angular relationship exists between two edges thereof. Similarly, reference to masks herein is intended to incorporate within its purview plates of other types, particularly those of a fragile nature.

In view of the foregoing, the present invention relates to the handling and treating of square flat mask plates which are precisely oriented by utilizing a right angled corner between adjacent edges of such plates, and effecting transfer thereof to a treating station without losing the predetermined orientation effected thereby.

Still more particularly, this invention relates to an improved apparatus and method for precisely locating square masks following introduction therof into a manufacturing sequence, transferring the same onto a rotatable chuck without losing the precise orientation imparted thereto, followed by transfer thereof from the rotatable chuck after the desired treatment has been effected thereon.

From the foregoing, it should be understood that objects of the invention include: the provision of an improved apparatus and method for handling and transporting articles, such as fragile square mask plates used in the production of semi-conductor devices; the provision of an improved mask treating apparatus which includes means for precisely locating a mask prior to transfer thereof to a treating station without altering the precise orientation thereof during such transfer; the provision of improved apparatus and method for handling and transferring masks from an orienting station to a spinning station, and subsequently from the spinning station to a discharge station; and the provision of an improved procedure for handling and transporting square mask plates between infeed and outfeed stations, with an intermediate stop at a treating station defined by a spinable chuck upon which the mask is rapidly rotated during treatment thereof.

These and other objects of the invention and various aspects thereof will become apparent from a study of the following detailed description in which reference is directed to the attached drawings.

DESCRIPTION OF THE DRAWING

FIG. 1 is a plan view, generally schematic in nature, of that portion of a mask handling apparatus and method which illustrates the subject invention incorporated therein.

FIG. 2 is a vertical sectional view through the subject apparatus taken in the plane of line 2—2 of FIG. 1.

FIG. 3 is a plan view, with associated structural details eliminated for clarity of illustration, of the rotatable chuck of the subject apparatus illustrating a mask improperly aligned thereon.

FIG. 4 is a vertical sectional view through the subject apparatus taken in the plane of line 4—4 of FIG. 1 illustrating a mask properly oriented on the rotatable chuck.

DESCRIPTION OF THE PREFERRED EMBODIMENT

The drawings and description contained herein depict features of an improved sequential mask handling apparatus and method by means of which square mask plates are automatically fed from an indexable infeed magazine onto an associated fluid bearing track structure; positioned by such track structure in a precise, predetermined location relative to a vacuum transfer arm; transferred by such vacuum arm while the precise orientation of the plate is maintained; and positioned by the arm onto an associated rotatable chuck at a treating station where predetermined treatment is effected thereon. Following such treatment, transfer of the treated mask by a second vacuum transfer arm onto a second fluid bearing track structure is effected; followed by insertion of such treated mask into an associated indexable discharge magazine. All such handling and treating steps are automatic, requiring no operator attention in conjunction therewith, except for replacement of the infeed and discharge magazines as required.

The preferred embodiment of the subject apparatus and the article handling procedure and steps effected thereby is best seen generally schematically in the showing of FIG. 1. The subject apparatus is generally designated 1 and comprises three principal sections or stations, namely, an infeed or input station generally designated 2, an intermediate treating station generally designated 3, and an outfeed or discharge station generally designated 4. It is between the infeed station 2 and the outfeed station 4 that mask plates M are moved in sequence to and past the treating station 3 in the manner to be described.

It should be understood that the subject apparatus preferably is self-containing and requires operator attention only to insure a quantity of masks to be treated are periodically positioned at the infeed station 2 and that a quantity of masks following treatment are periodically removed from the discharge station 4. Except for such periodic attention, barring misalignment of a mask at the treating station 3 as described hereinafter, operator attention is not required, and the subject apparatus is fully automatic.

As noted from FIG. 1, the infeed station 2 is defined by a mask feeding mechanism generally designated 6 by which individual masks M are discharged in sequence onto an associated fluid bearing track structure generally designated 7. It should be understood that the feed mechanism includes an infeed magazine generally designated 8 which is supported in known fashion for downward sequential indexing so that the lowermost mask in the magazine may be sequentially removed therefrom and placed on the fluid bearing track structure as required during the handling procedure. In that regard, it should be understood that the magazine 8 has a plurality of vertically spaced slots in opposite portions thereof in which opposite edges of successive masks are located. As required, a magazine carrying a plurality of masks, such as twenty-five, is introduced into the apparatus by the operator. Upon downward indexing of the feed magazine 8, successive masks are withdrawn therefrom and placed on the fluid bearing track structure 7 in known fashion.

In that regard, reference is directed to the aforementioned Lasch, Jr. et al. U.S. Pat. No. 3,645,581 for an illustration and description of an indexable magazine and an associated aforementioned Lasch, Jr. et al. U.S. Pat. No. 3,645,581 for an illustration and description of an indexable magazine and an associated fluid bearing track structure for periodically withdrawing substrates therefrom. While such patent described such an indexable magazine and track structure in conjunction with the handling of generally circular articles, such as semi-conductor wafers, its applicability to the handling of square plate-like articles, such as the subject masks, should be apparent.

Track structure 7 employed with the feed magazine may take various forms, including the form shown in said Lasch, Jr. et al. U.S. Pat. No. 3,645,581. However, preferably, such track structure utilizes the less complicated construction shown in Lasch U.S. Pat. No. 3,718,371.

In that latter regard, reference is directed to FIG. 2 hereof for an illustration of such track structure, which has been illustrated to correspond generally with the showing of FIG. 1 of said patent, with modifications thereof to meet the specific requirements of the present invention.

Such fluid bearing track structure comprises cooperable first and second track structural members 8 and 9 with an extension 11 of member 9 underlying and contacting cooperable member 8. Interposed between such members is a flexible metal or equivalent jet insert strip 12 having directional fluid passages therein as illustrated in said U.S. Pat. No. 3,718,371. Supporting fluid, such as air under pressure, is introduced through a phenum chamber 13 from any suitable source (not shown) into the directional fluid passages provided in one or both sides of the insert strip 12. Thus, in known fashion as described in said patents, upon fluid emanating from the plenum chamber 13 and into and through the directional fluid passages in the insert strip 12, a layer of supporting fluid emanates from the top surface 14 of the track structure along its length to support a mask M brought into adjacent relationship relative thereto.

While only one insert strip 12 is shown in the fluid bearing track structure 7 illustrated in FIG. 1, it should be understood that two or more such strips, arranged in parallel relationship, may be positioned to extend longitudinally of the track structure as may be required, depending upon the size and weight of the masks to be transported thereon.

In that regard, as described in said Lasch, Jr. et al. U.S. Pat. No. 3,645,581, upon feed magazine 8 being indexed downwardly by a suitable feed mechanism associated therewith (not shown), the lowermost mask M of the supply in the magazine is brought into overlying relationship relative to the outer end 16 of the track structure 7. Thus, upon supporting fluid being introduced through the fluid passages defined by the track structure, the lowermost mask is removed from the carrier and is transported in the direction of the arrow shown at the left of FIG. 1 toward the inner end 17 of the track structure.

In known fashion, a sensor is provided in conjunction with the infeed magazine 8 and track structure 7 to sense when a subsequent mask is to be fed from the magazine by the fluid bearing, such subsequent feeding being effected by indexing the magazine another step downwardly to bring a succeeding mask into position above the outer end 16 of the track structure so that removal thereof may be effected by the fluid emanating from the track structure.

The feeding of successive masks is effected in sequence until magazine 8 is completely empty, at which time a suitable signal is transmitted by the sensor indicating attention by the machine operator is required so that another filled magazine may be placed in position of the now empty magazine 8.

It should be understood with respect to the discharge end 4 of the apparatus that a similar discharge magazine 21 is positioned at such end for receiving in sequence a series of masks after the same have been treated at the treating station 3. Discharge magazine 21 is identical in construction to infeed magazine 8 in FIG. 1 but is indexable in the opposite direction by a suitable indexing mechanism (not shown). That is, magazine 21 is indexable upwardly in sequential steps following the introduction of each successive mask thereinto. Thus, an empty slot may be presented to the associated fluid bearing track structure 22 so that successive masks may be introduced thereinto. Suitable sensing means are associated with the discharge carrier to effect sequential indexing thereof as required.

Masks are fed into the upwardly indexable magazine 21 by the associated fluid bearing track structure generally designated 22 which corresponds to the track structure 7 described previously. As will be described, masks in sequence are placed on the inner end 23 of the fluid bearing track structure 22 by a vacuum transfer arm and are moved over the fluid bearing track structure on a fluid bearing toward the outer end 24 of the track structure which underlies and extends into the discharge magazine 21. As noted, a sensor (not shown) of any suitable type is provided in conjunction with the discharge magazine 21 to determine when a mask has been inserted into the discharge magazine and to transmit a control signal to the indexing mechanism therefor to raise the magazine one step so that the magazine is properly oriented to receive a subsequent mask in an empty slot therein in the fashion also described in said Lasch, Jr. et al. U.S. Pat. No. 3,645,581.

To prevent lateral displacement of a mask traveling over either of the infeed fluid bearing track structure 7 or the discharge fluid bearing track structure 22, a guide shoulder is provided to extend longitudinally along each of such track structures, the guide shoulder of track structure 7 being designated 26 and the guide shoulder of track structure 22 being designated 27.

As noted previously, an important aspect of this invention is the efficient and effective orientation of each mask fed from the supply magazine 8 to a predetermined and precisely oriented pick-up position from which the same may be transferred to the treating station 3. To such end, the appartus is provided with stop means for precisely locating each successive mask fed from the feed magazine 8.

Such stop means in the embodiment illustrated is generally designated 31 and comprises a generally L-shaped stop shoulder which is positioned on and carried by a first vacuum transfer arm 32 mounted for pivotal movement between the feed station 2 and the treating station 3. In that regard, the stop shoulder 31 is defined by two right-angularly oriented shoulder sections integrally connected with each other and secured to the upper surface of the vacuum transfer arm 32. The stop shoulder may be formed integral with the arm 32 as shown in FIG. 2 or, if preferred, the stop shoulder may be formed as a separate part held in place on the arm by screws or other suitable fastening means (not shown).

It will be noted that the stop shoulder 31 includes a longitudinally extend portion 33 which extends along the fluid bearing track 7 in parallel relationship to the opposing guide shoulder 26. The stop shoulder 31 also includes a transversely extending portion 34 which is positioned directly in the path of each mask fed from the feed magazine 8. Portion 34 extends at right angles to portion 33 and prevents movement of each mask beyond the position shown to the left of FIG. 1.

It should be understood that the vacuum arm 32 is activated about the vertical axis 36 of a mounting shaft by any suitable mechanism (not shown) which precisely positions the arm in the two locations shown in FIG. 1. When positioned in the solid line location, the stop shoulder 31 is properly located to precisely receive a mask in the predetermined orientation shown in such figure.

To insure location of each mask with two of its right angled edges contacting relationship with the right angled portions 33 and 34 of the stop shoulder 31 as seen in FIG. 1, means is provided for urging each succeeding mask laterally of the fluid bearing track structure 7 while the same is supported on the cushion of air emanating upwardly through the track structure. Such urging means in the illustrated embodiment comprises a laterally directed air jet, designated 41, which emanates from a lateral air passage 42 extending through guide shoulder 26. Passage 42 is supplied by any suitable pneumatic source, such as supply hose 43. Thus, as each successive mask M is withdrawn from infeed magazine 8 by the air bearing 7 and moved therealong, the lateral air jet 41 impinges an edge of the mask and urges the same into edge-to-edge contact with the two portions 33 and 34 of the top shoulder 31. Because each mask is supported by a cushion of air emanating from the fluid bearing track structure, lateral movement thereof by lateral jet 41 to the precise location noted is simple to effect.

Upon the mask being urged into the position shown in FIG. 1, vacuum is introduced through a vacuum slot 46 which extends across the end of the vacuum arm 32. The vacuum slot 46 is connected, via conduit 47 extending longitudinally of arm 32, with any suitable source of vacuum in known fashion.

It should be understood that preferably air under pressure is emanating from the fluid bearing track structure 7 and from the lateral jet 41 associated therewith at all times. However, vacuum preferably is applied only intermittently through slot 46 following a predetermined time lapse after a mask has been removed from the feed magazine 8 as sensed by the control mechanism described previously. Thus, each succeeding mask fed one at a time against the stop shoulder 31 may be picked up by the vacuum arm 32.

Upon vacuum being applied to the mask shown in the position of FIG. 1, the vacuum arm is rotated by its operating mechanism (not shown) and travels through a 90° arc to position the mask held by the vacuum pressure thereon onto a predetermined portion of the treating mechanism positioned at the treating station. When the vacuum arm 32 positions at mask at the treating station as shown in dotted lines in FIG. 1 and in the manner to be described, the arm returns to the solid line position shown in FIG. 1, and a subsequent mask is moved from the feed magazine when the sensor indicates that stop shoulder 31 is free of a mask thereat.

Means at the treating station in the illustrated embodiment is provided to effect a treating step on each mask positioned thereat. By way of illustration, the subject means is designed to apply a layer of photo-resist material onto the upper surface of the mask after the mask has been properly positioned at the treating station. In that regard, reference is directed to the aforementioned Lasch, Jr. et al. U.S. Pat. No. 3,645,581 for a description of a suitable mechanism for applying such a photo-resist material to the mask in known fashion. Briefly, however, it should be understood that the treating station is provided with a supply tank 51 of such photo-resist material; a supply line 52 extends from the tank 51 to a position overlying the center of the mask for dispensing predetermined sequential quantities of a photo-resist material (or other suitable liquid) onto the upper surface of the mask for the purpose well known in the semi-conductor manufacturing art.

Such photo-resist material is spread evenly over the upper surface of the mask upon rapid rotation of the mask. In that regard, the treating station is provided with a rotatable chuck member, generally designated 56, upon the upper surface of which the mask M is accurately positioned by the vacuum arm 32. The chuck includes, as seen in FIG. 4, a supporting shaft 57 depending from an upper generally planar surface 58 thereof; the shaft 57 is received in a bearing 59 which supports the same for rapid rotation in known fashion by any suitable rotating means (not shown).

The shaft 57 is hollow and includes a bore 61 through which a vacuum atmosphere may be introduced to the upper surface 58 of the chuck. Communicating with the bore are a series of vacuum passages 62 which open onto the upper surface 58 of the chuck so that vacuum atmosphere may be applied to the undersurface of each mask M positioned on the chuck by the vacuum arm 32.

It should be understood that the source of vacuum for the chuck and for the vacuum arm 32 is synchronized so that when the chuck is properly located, vacuum is applied thereto and thereby to the undersurface of each mask plate presented thereto at the precise time when vacuum is cut off from the vacuum arm 32. Synchronization of such vacuum transfer is effected by any suitable control valve means of which many are known.

To complete such tranfer, the chuck is vertically movable in the manner described in said Lasch, Jr. et al. U.S. Pat. No. 3,645,581, or by any other suitable means. The purpose of such vertical movement is to permit the mask carried by the vacuum arm to clear or pass over specially designed barrier structure provided at each of the opposed end portions 66 and 67 of the chuck. In that regard, the chuck may take any of various configurations. In the embodiment shown, the chuck is generally rectangular in outline. The barrier structure provided on the illustrated chuck comprises two raised shoulder portions 68 and 69 provided at each of the opposite ends thereof. Each pair of such barrier shoulder portions defines therebetween a right angled recess (as best shown in FIG. 3), the purpose of which is to receive therein a corner portion of a mask submitted thereto. A slight dimensional clearance is designed to exist between the opposed corners of a mask and the inner surfaces of the barrier shoulder portions of the barrier structure, as seen in FIG. 1, when a mask is properly oriented on the chuck 56.

The barrier structure is designed for two purposes: first, the barrier shoulder portions prevent a mask from shifting laterally during high speed rotation of the chuck to prevent thereby the mask from being thrown out of engagement with the chuck should the vacuum be insufficient to hold the same in position thereon; and, second, the barrier shoulder portions insure proper positioning of the mask on the chuck and preclude operation of the chuck in the absence of such proper orientation.

In that regard, referring to FIG. 3, it should be understood that if, for some reason, the vacuum transfer arm 32 does not properly position the opposed corners of a mask between the barrier structures of the chuck so that the undersurface of the mask is prevented from coming into direct contact with the upper surface 58 of the chuck, a sensor (not shown) recognizes such misalignment of the mask and prevents rotation of the chuck and dispensing of any fluid from the supply tank 51 onto the upper surface of the mask. Such sensor also transmits a visual or audible signal to the operator which indicates that a mask is not properly aligned so that manual correction of the situation may be effected.

When a mask is properly positioned in contact with the upper surface of the chuck with its opposite corners received between the opposed barrier structures, as seen in FIGS. 1 and 4, the spinning operation described will be effected automatically. To prevent any photo-resist material from being thrown by centrifugal force beyond the treating station 3, a cup (designated 86 in FIG. 1) is elevated in conjunction with elevation of the chuck 56 to catch any such excess material.

Following treatment of a mask at the treating station, chuck rotation is halted and the chuck is brought to rest and precisely located in the position shown in FIG. 1. A second vacuum tansfer arm 71 is then brought into the dotted line position shown in FIG. 1 by any suitable mechanism to remove such treated mask therefrom and to transfer the same to the solid line position shown in FIG. 1 about the axis of rotation 72 of a mounting shaft shown in such figure. The vacuum arm 71 is constructed substantially identically to the vacuum arm 32 except for the fact the same does not include an L-shaped stop shoulder of the type shown at 31 in FIG. 1. However, vacuum arm 71 includes a straight stop shoulder 73 secured thereto or formed integral therewith against which an edge of a mask is engaged during transfer. The vacuum arm 71 includes a vacuum slot 74 operatively connected by a vacuum conduit 76 with a suitable source of vacuum, as seen in such figure.

When rotation of chuck 56 is halted, cup 86 is retracted, i.e. moved downwardly; then the transfer arm 71 is moved to the dotted line position shown in FIG. 1; then the chuck 56 is retracted, i.e., moved downwardly; vacuum is then disconnected from the chuck at the same time vacuum is applied through slot 74 to arm 71, and transfer of a mask from the chuck to the arm 71 is effected without damaging the mask. Thereafter, the transfer arm 71 is rotated through a 90° arc to bring the treated mask to overlying relationship with the discharge fluid bearing track structure 22. When positioned in the solid line location shown in FIG. 1, vacuum to the transfer arm 71 is discontinued and air bearing fluid is introduced through track structure 22 which moves the mask to the right in FIG. 1 into a waiting slot in discharge magazine 21.

It should be understood from the foregoing that the sequence of movement and treatment of successive masks in the manner seen in FIG. 1 is effected automatically in the manner described, with operator attention being required only periodically to replace infeed magazine 8 with another filled magazine and to replace discharge magazine 21 with another empty magazine. Appropriate operator control signals are provided with the apparatus to advise the operator in that regard.

Because the fluid bearing pressures and vacuum pressures required to support a mask and hold the same on a vacuum arm during movement and transfer thereof between the noted stations will vary, depending upon the size and weight of a given mask, illustrative pressure levels therefor have not been presented because such values are within the capability of any qualified engineer.

Referring again to FIG. 1, the precise movement of a mask through the apparatus is illustrated by reference to corner 81 of a mask as it is positioned in its various locations at the feed end 2, treating station 3, and discharge station 4. The arcuate paths such corner takes as it moves between the respective stations is illustrated by the dotted lines 82 and 83 shown in FIG. 1.

From the foregoing, it should be understood that the present invention involves an improved mask plate handling apparatus and method and the protection afforded thereto is indicated by the scope of the appended claims.

I claim:
1. A method of handling polygonal masks to orient the masks in sequence with their corners in a particular orientation prior to transferring said masks from an orienting station to a treating station, comprising:
   A. providing a directional fluid bearing track structure at said orienting station,
   B. feeding a series of polygonal masks in sequence from a supply thereof and positioning said masks in sequence upon said track structure,
   C. providing stop means adjacent said track structure which includes an angular stop shoulder contoured in accordance with the corner configurations of said polygonal masks,
   D. mounting said stop means along an edge of but separate from said track structure for movement relative to said track structure while said track structure remains stationary,
   E. supporting said polygonal masks on a fluid cushioning emanating from said track structure and moving such masks when thus supported by said fluid cushion in sequence along said track structure with an edge thereof in generally leading relationship,
   F. as each said polygonal mask moves along said track structure, urging each such mask generally laterally of said track structure while such mask is supported by said fluid cushion to move a corner thereof into close conformity with said angular stop shoulder of said stop means, and,
   G. as each said polygonal mask in sequence is urged against said stop shoulder, grasping each such mask with transfer means and moving such mask away from said track structure to a treating station without disturbing the orientation of said corner imparted to each such mask by said stop shoulder.

2. The method of claim 1 in which said grasping and movement of each said polygonal mask is effected in sequence by a vacuum arm, upon which said stop means is mounted, movably positionable between a location adjacent said edge of said track structure to a location adjacent said treating station.

3. The method of claim 1 which further includes
   H. positioning each said polygonal mask in sequence at said treating station on a rotatable chuck while positively retaining said orientation thereof so that damage to each such mask is precluded during rotation by said chuck.

4. The method of claim 1 in which each said polygonal mask is urged generally laterally of said track structure by directing a fluid jet against an edge of each such mask in sequence while each such mask is supported on said fluid cushion adjacent said stop means.

* * * * *